United States Patent [19]
Capici et al.

[11] Patent Number: 5,852,632
[45] Date of Patent: Dec. 22, 1998

[54] RECOVERY OF THE PROPAGATION DELAY IN A PWM CIRCUIT

[75] Inventors: Salvatore V. Capici, Barrafranca; Antonio Magazzu', Messina, both of Italy

[73] Assignee: Consorzio Per La Ricerca Sulla Microelectronica Nel Mezzorgiorno, Catania, Italy

[21] Appl. No.: 744,714

[22] Filed: Oct. 29, 1996

[30] Foreign Application Priority Data

Oct. 31, 1995 [EP] European Pat. Off. .............. 95830463

[51] Int. Cl.$^6$ ................................. H03K 7/08; H03K 9/08
[52] U.S. Cl. .......................... 375/238; 388/915; 388/804
[58] Field of Search ............................. 375/238; 388/915, 388/804, 811, 829, 831; 318/811; 332/109, 110

[56] References Cited

U.S. PATENT DOCUMENTS

| | | | |
|---|---|---|---|
| 3,914,623 | 10/1975 | Clancy | 307/229 |
| 4,268,794 | 5/1981 | Handte et al. | 328/185 |
| 4,549,151 | 10/1985 | Kaneko | 332/9 |
| 4,612,463 | 9/1986 | Kikuchi . | |
| 5,283,515 | 2/1994 | Jordan | 323/288 |
| 5,295,158 | 3/1994 | Jordan | 375/22 |
| 5,298,871 | 3/1994 | Shimohara | 332/109 |
| 5,331,208 | 7/1994 | Meyer | 307/273 |
| 5,361,048 | 11/1994 | Baum et al. . | |
| 5,379,321 | 1/1995 | Girmay | 375/22 |
| 5,553,096 | 9/1996 | Messman | 375/238 |
| 5,606,296 | 2/1997 | Seong | 332/109 |
| 5,640,131 | 6/1997 | Kawasaki et al. | 332/109 |

FOREIGN PATENT DOCUMENTS

0610034 of 0000 European Pat. Off. .

*Primary Examiner*—Stephen Chin
*Assistant Examiner*—Mohammad Ghayour
*Attorney, Agent, or Firm*—Allen, Dyer, Doppelt, Milbrath & Gilchrist, P.A.

[57] ABSTRACT

Switching and propagation delays in generating a PWM control signal by a circuit that generally includes an error amplifier, a sawtooth oscillator and a comparator for comparing the error signal with the sawtooth signal, is compensated by generating a second sawtooth signal synchronous with the master sawtooth signal but having a reduced discharge time and by applying the second synchronous sawtooth signal to the respective input of the PWM comparator.

17 Claims, 6 Drawing Sheets

RECOVERY OF THE PROPAGATION DELAY IN A PWM CIRCUIT

CROSS-REFERENCE TO RELATED APPLICATION

This application claims priority from European Application 95830463.6, filed Oct. 31, 1995, which is hereby incorporated by reference. However, the content of the present application is not necessarily identical to that of the priority application.

BACKGROUND AND SUMMARY OF THE INVENTION

The so-called pulse width modulator circuit (PWM) constitutes a building block in many regulation and control circuits. A typical application of this circuit is in switching mode regulators including a voltage mode control loop.

Figure 1:
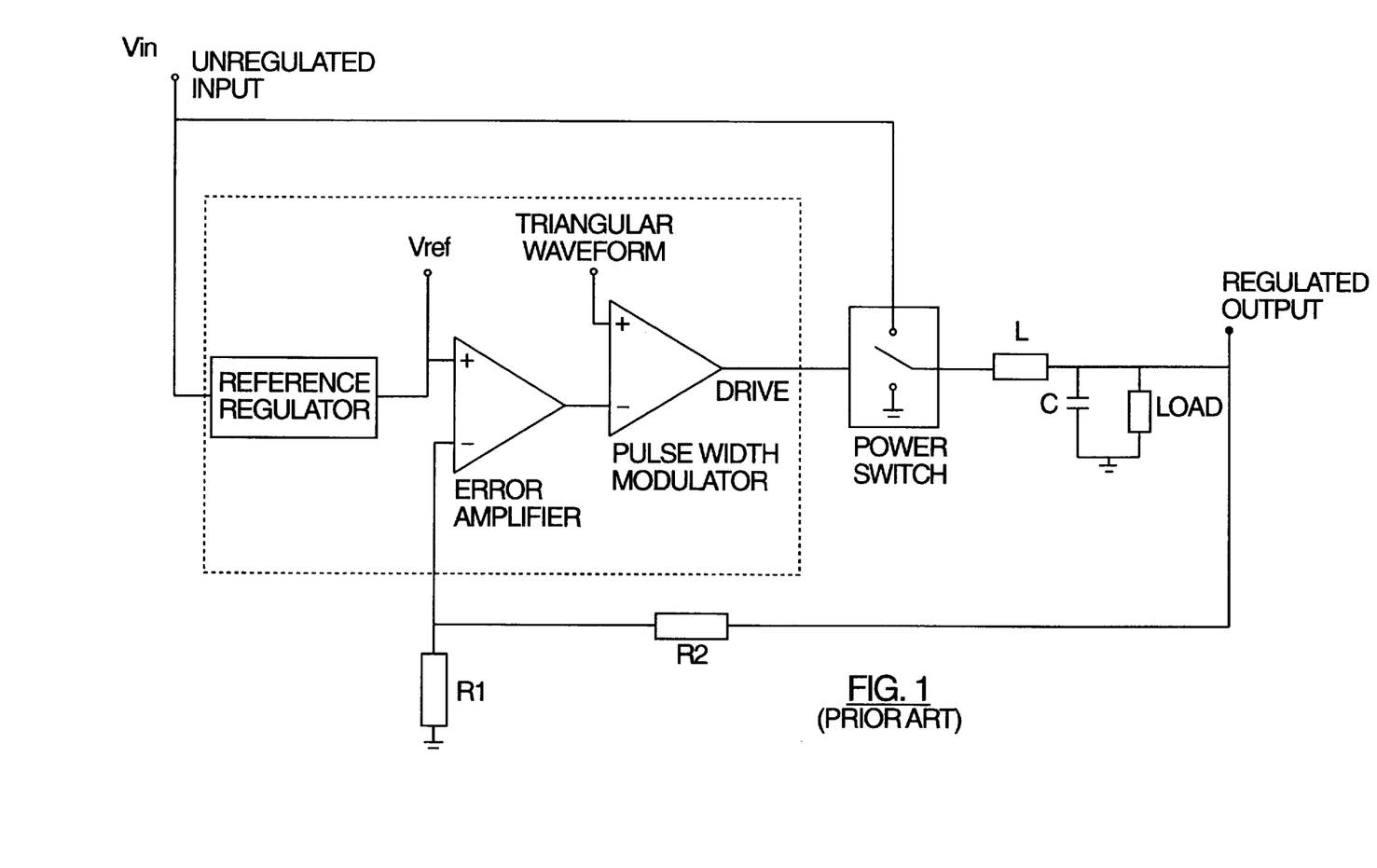
FIG. 1 shows a typical scheme of a voltage mode regulation loop that includes a pulse width modulator.

According to the diagram shown in FIG. 1, a sawtooth signal generated by a local oscillator and the output signal of an error amplifier are customarily applied to the inputs of the pulse width modulator (PWM).

The function of a PWM is that of providing as output a turn-on or a turn-off command or information for opening or closing a device, for example, a power switch, depending on whether the error amplifier output is at a higher or lower potential than that of the sawtooth signal.

Figure 2:
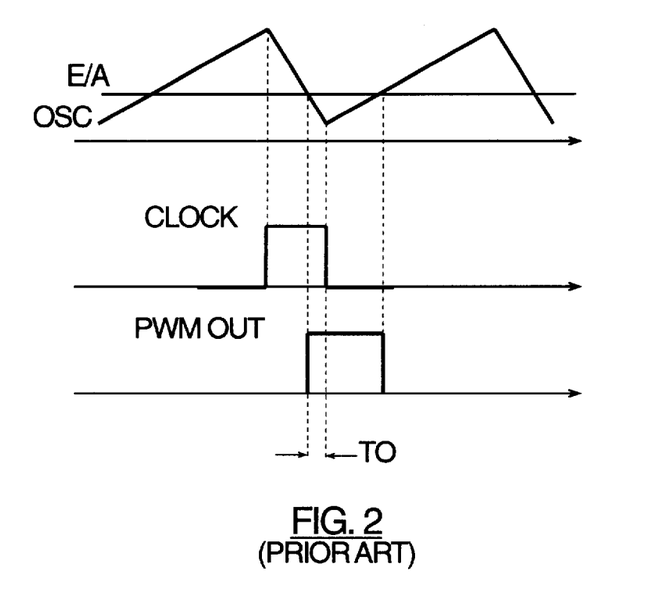
FIG. 2 depicts the functioning of the PWM regulation loop by illustrating the forms of the respective signals.
Figure 3:
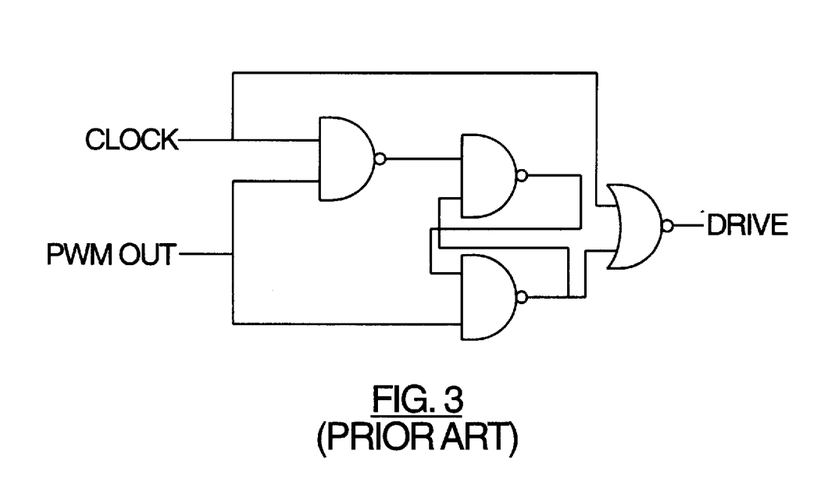
FIG. 3 is an example of a driving logic circuit of a power switch controlled by a PWM loop.

This information is "stored" by the system and, if at the end of the oscillator discharge phase, which includes the descending portion of the sawtooth signal, the PWM output state is such as to impose the turn-off of the driven device, the power switch remains turned off until the next cycle. This function is illustrated by way of the signal diagrams shown in FIG. 2. The driving logic circuit of the device controlled by the PWM loop, which essentially comprises a bistable or flip-flop circuit, can be realized according to the embodiment shown in FIG. 3.

In reality, both the PWM circuit and the driving logic circuit of the power device introduce a non-null generation and propagation time of the PWM control signal, which is commonly due to the triggering delay of the comparator of the PWM circuit and in part to the propagation delay of the signal through the logic gates of the driving circuit.

This propagation delay may, under certain operating conditions, create problems for the correct functioning of the system.

The discharge phase of the oscillator (the discharge or descending ramp of the sawtooth signal produced by the oscillator) is generally faster than the charge or rising ramp, and under conditions of a very low duty cycle, the output voltage of the error amplifier is relatively low.

Such a voltage is approximately determined by the following expression:

$$V_{out_{g/A}} = D.C. \times (V_{OSC_{MAX}} - V_{OSC_{MIN}}) + V_{OSC_{MIN}}$$

Figure 4:
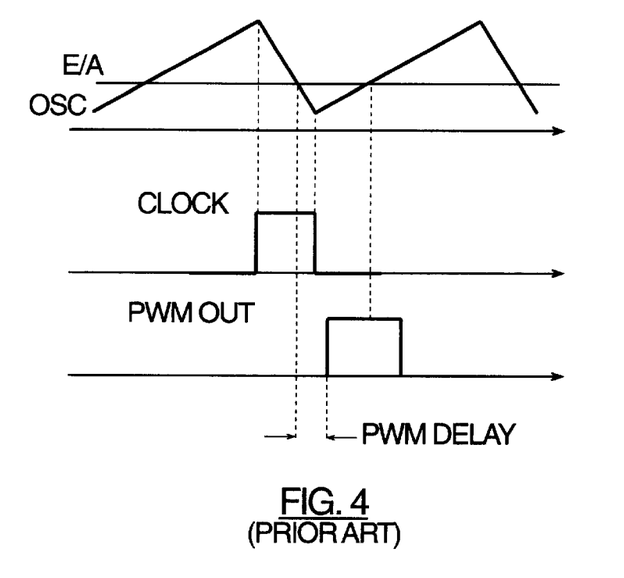
FIG. 4 highlights the problem of a missed storing of the turn-on command under particularly critical operating conditions of the PWM controlled loop.

Under low duty-cycle conditions, the error amplifier output is low and the propagation delay of the PWM signal may be such as to provide a switch-on command to the power switch after the high-to-low transition of the clock signal. The occurrence of such situations is illustrated in the diagrams of FIG. 4.

Therefore, in order to store the information (PWM output), the propagation time of the PWM signal must comply with the following expression:

$$t_{PWM_{delay}} \leq t_0 = t_{discharge_{OSC}} \times D.C.$$

Employing a very fast comparator prevents the occurrence of the above stated situation, in which a missed storing of the turn-on command of the power switch may cause the circuit to function at an irregular frequency.

In order to avoid this problem linked to speed limitations of the circuits, the information supplied by the comparator of the PWM circuit must be stored even at an instant successive to the high-to-low transition of the clock signal.

One known method employs a modified clock signal, instead of the system's clock signal, whose duration is longer (delayed clock) so as to ensure the storing of the information provided by the output by the PWM comparator even under critical operating conditions of the circuit.

Figure 5A:
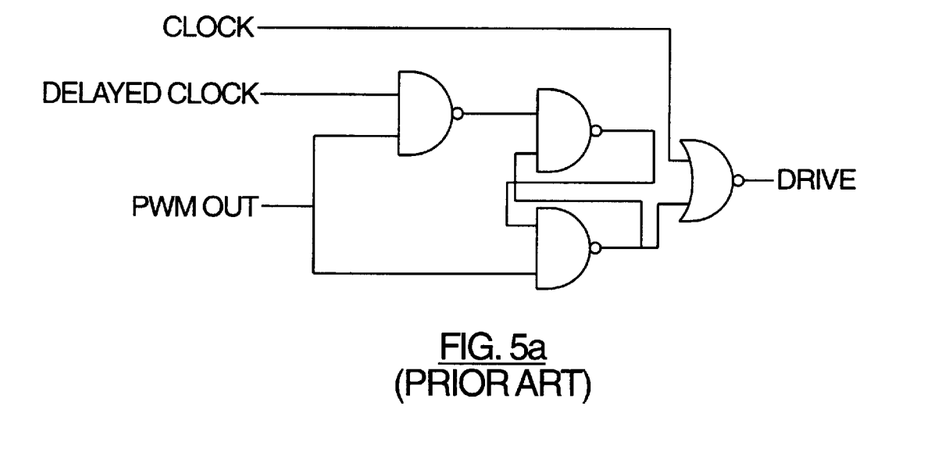
FIGS. 5a and 5b show a well known solution based on the use of a dedicated delayed clock signal.
Figure 5B:
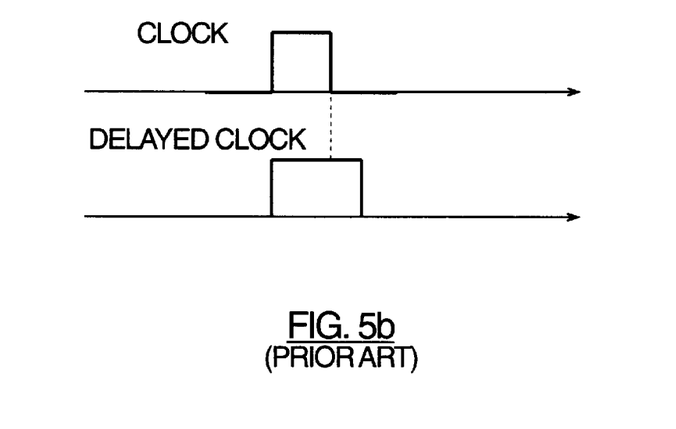

This solution is schematically shown in FIG. 5. Even though it is relatively simple to generate a "delayed clock" signal having appropriate characteristics for overcoming the aforementioned problem, this well known solution may introduce another problem.

While the basic circuit either does or does not force the opening of the power switch in coincidence with the high-to-low transition of the clock signal, the use of a delayed clock signal permits the turn-on of the power switch at any instant of the time interval that elapses between the high-to-low transient of the master clock and that of the delayed clock. This causes repeated nonsynchronous turns-on that may create problems for the correct functioning of the entire system.

The present invention provides an improved method and device for recovering or compensating the progagation delay of the signal produced by the comparator of a pulse width modulator circuit, while safeguarding the maintenance of a perfect synchronism of the repeated switching on of the system's clock signal. This purpose is fully attained by the method and by the relative device object of the present invention that are based on a modifying intervention of the discharge ramp of the sawtooth signal generated by the local oscillator. The modification introduced allows the application to the relative input of the PWM comparator of a sawtooth signal whose discharge ramp is made steeper, such that its duration is reduced by a fraction of time sufficient to recover the propagation delay of the PWM signal.

Although it would be sufficient to reduce the duration of the discharge ramp by a fraction of the expected maximum delay of generation and propagation of the PWM signal, it is more practical and effective to reduce the duration of the discharge ramp by an amount abundantly larger than the expected maximum propagation delay. For example, if an 80 ns propagation delay of the PWM signal is established, a time reduction of 100 ns of the duration of the discharge ramp of the sawtooth signal will assure the correct functioning even under particularly critical conditions.

In this way, the propagation delay will always be amply and positively compensated or recovered, by anticipating the crossing instant between the modified sawtooth signal and the output signal of the error amplifier.

This system eliminates any need of employing a second (delayed) clock signal.

The descending portion of the sawtooth signal produced by the local oscillator can be made steeper in many different ways. Basically, it is sufficient to accelerate the discharge process by forcing a certain discharging current higher than what the sawtooth oscillator would provide for.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 6:
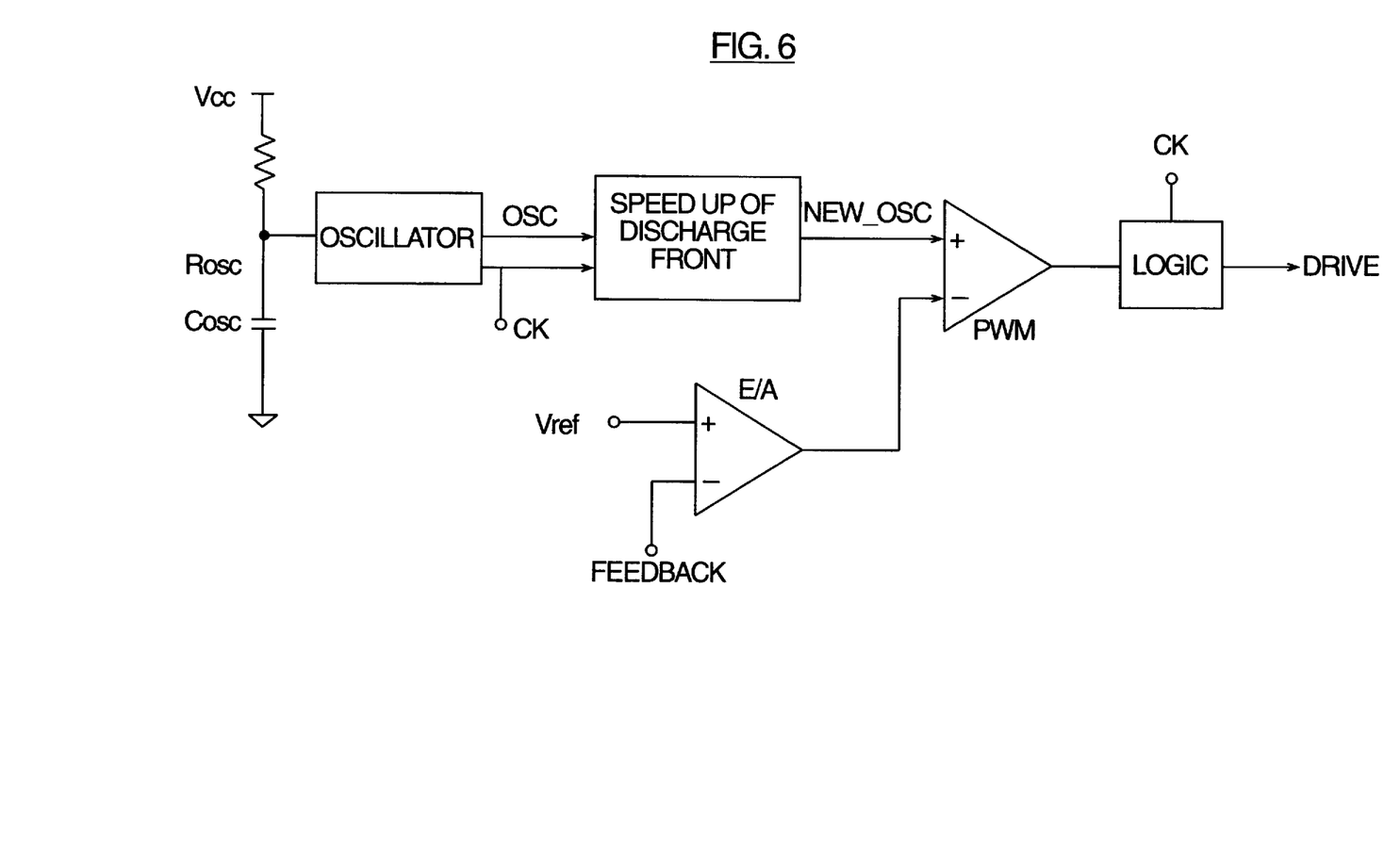
FIG. 6 is a block diagram of a PWM circuit realized according to the present invention.

The numerous innovative teachings of the present application will be described with particular reference to the presently preferred embodiment (by way of example, and not of limitation), in which:

Referring to the diagram of FIG. 6, the preferred embodiment of the system of the invention is realized by introducing a speeding up circuit block of the discharge or descending ramp of the sawtooth signal generated by the oscillator. The resistor ROSC charges the capacitor COSC at a ramp rate until the clock signal CK activates a transistor inside the oscillator OSCILLATOR to discharge the capacitor COSC, thereby enabling the oscillator to produce the sawtooth signal.

In practice, the circuit block SPEED UP OF DISCHARGE FRONT receives as an input the sawtooth signal OSC generated by the oscillator and produces as an output a new sawtooth signal NEW_OSC, substantially synchronous with the OSC input signal, but having the discharge or the descending ramp made steeper to reach the minimum value in a reduced time interval as compared to that of the input sawtooth signal OSC.

The period of the NEW_OSC signal remains substantially unchanged and identical to the period of the input signal OSC.

The new sawtooth signal NEW_OSC and a signal generated by the error amplifier E/A are applied to the inputs of the pulse width modulator PWM. The pulse width modulator circuit produces at output a signal for controlling a logic circuit LOGIC of a power device. The logic circuit LOGIC produces a logic drive signal DRIVE for driving the power device.

As will be evident to those skilled in the art, the logic circuit LOGIC can be implemented in many ways. For example, it can comprise a bistable or flip-flop circuit.

Figure 7:
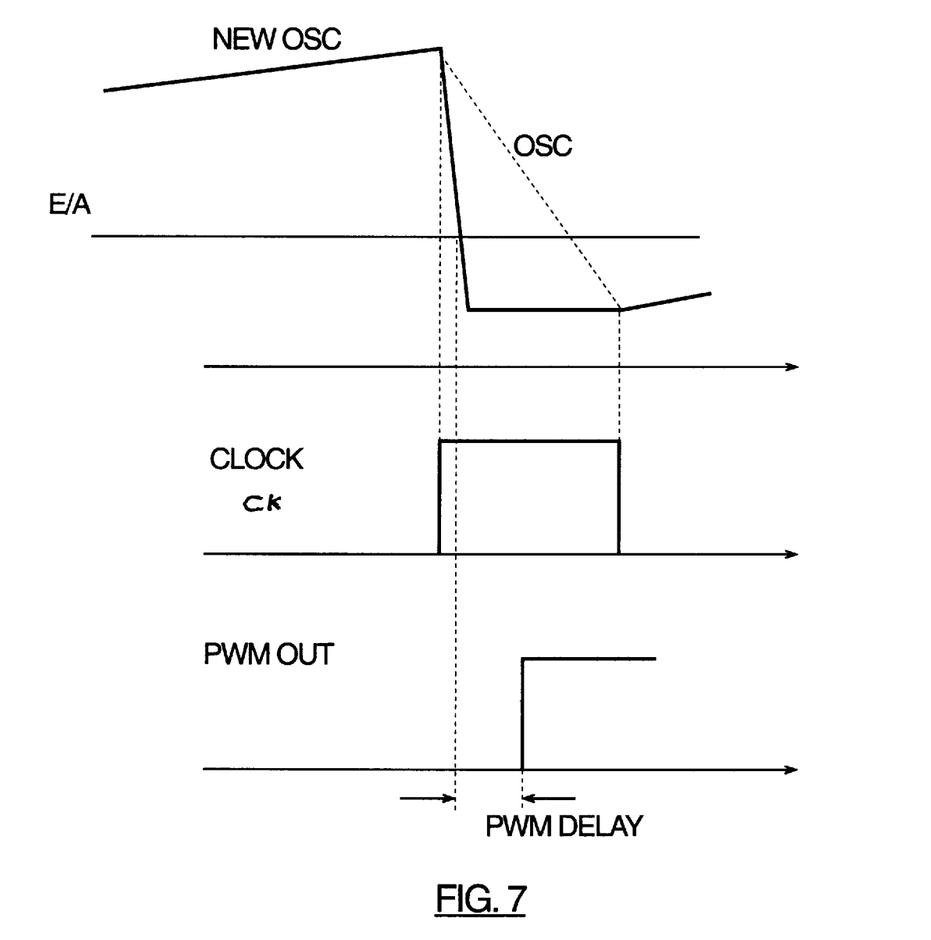
FIG. 7 shows the functioning of the circuit of this invention by illustrating the respective signals.

The first diagram of FIG. 7 shows the effect produced by the circuit block SPEED UP OF DISCHARGING FRONT on the sawtooth signal OSC generated by the oscillator.

The speeding up of the discharge anticipates crossing the output signal with the error amplifier E/A, thus practically preventing the occurrence of a missed storage of a turn-on command, even under conditions of accentuated delay of the PWM signal and of a particularly low value of the output voltage of the error amplifier E/A.

For sake of immediate comparison, the original discharge ramp of the sawtooth signal OSC produced by the oscillator is indicated by way of dashed lines in the diagram of FIG. 7.

It will be evident to those skilled in the art that the speeding up of the discharge ramp of the sawtooth signal may be circuitally implemented in many ways.

Figure 8:
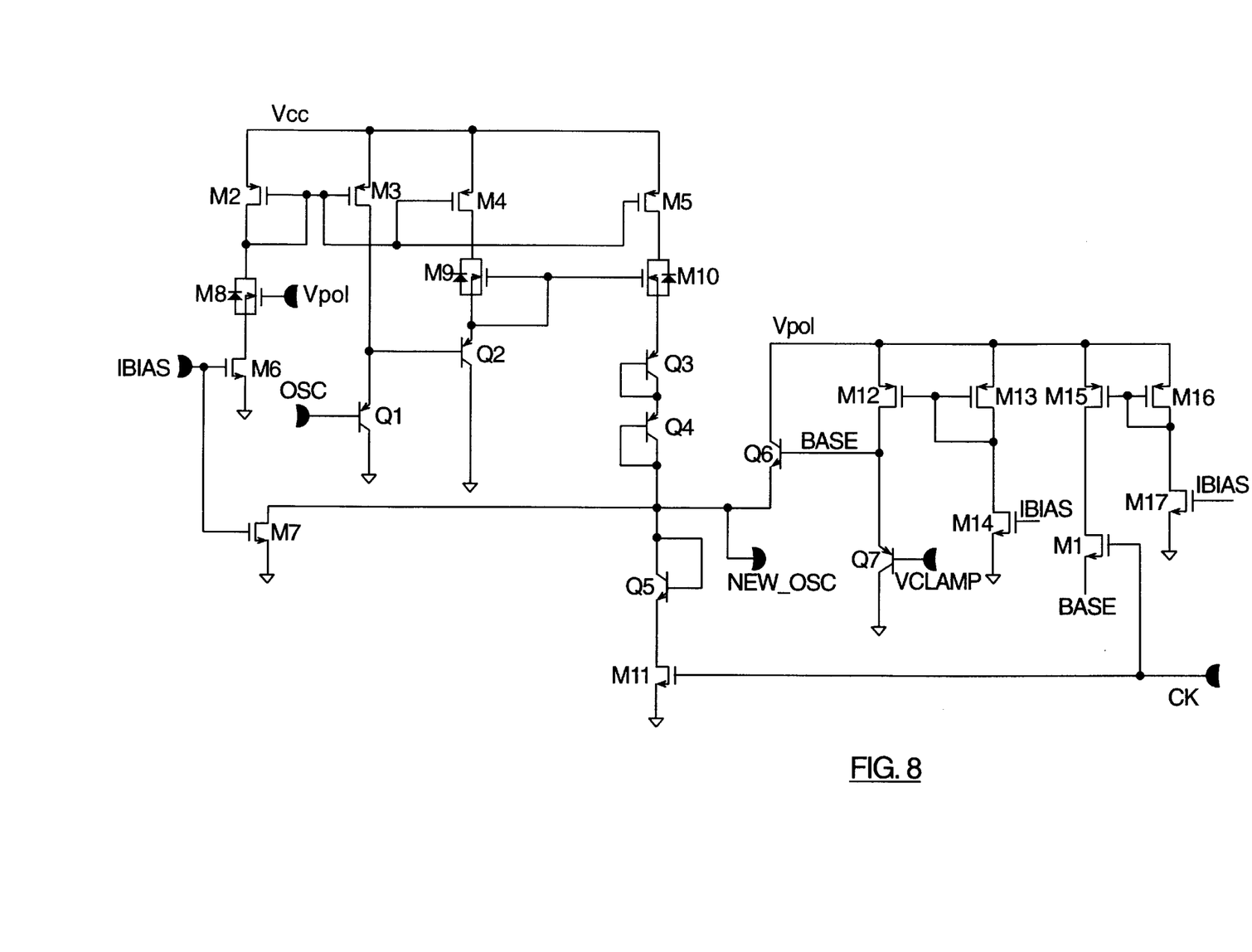
FIG. 8 illustrates a sample embodiment of the speeding up block of the discharge ramp of the basic scheme of FIG. 6.

FIG. 8 shows a sample embodiment of such a circuit. Referring to the scheme of FIG. 8, the sawtooth signal OSC, generated by the oscillator, is applied to the input of the circuit represented by the base of transistor Q1, whose current is identical to that flowing through M4, M9 and M10 by realizing, together with Q3 and Q4, a voltage follower.

The current levels are such as to produce a substantially negligible phase shift between OSC and NEW_OSC, at the frequencies of operation.

The particular input structure (Q1 and Q2) ensures an appropriate voltage withstanding capability when, under particular operating conditions, the OSC pin becomes tied to the supply voltage. For similar reasons, M8 is used as a level shifter in order to prevent possible breakdowns of M6. A signal IBIAS is used to bias the two current generators M6 and M7 to a correct level, while the signal Vpol biases the gate of M8. The transistors M2 and M3 function as a current mirror.

The PMOS M5 limits the maximum current that M10 may carry. Indeed, when the OSC discharge (CK) phase starts, the signal OSC_DISCHARGE goes high in order for M11 to anticipate the discharge signal of the NEW_OSC. While the NEW_OSC level drops rapidly, the source of M10 follows it, causing an increase of the Vgs of the VDMOS, which therefore delivers a higher current. This higher current partially or totally compensates the discharge current of the NEW_OSC (which is obtained by an appropriate dimensioning of M11), thus nullifying the effect of the entire circuit at a certain point of the discharge ramp.

Q6, Q7, M12, M13 and M14 define a "clamp" capable of fixing the amplitude of the NEW_OSC signal which in the embodiment of the example is equal to 0.89 V, while the minimum threshold of the OSC signal is 0.9 V.

M15, M16, M17 and M1 define a circuit capable of increasing the current through the "clamp" circuit during the discharge ramp in order to prevent the amplitude of input signal NEW-OSC from decreasing excessively.

According to a disclosed class of innovative embodiments, there is provided a pulse width modulator circuit, comprising: a sawtooth oscillator for generating a first sawtooth signal having a charge ramp and a discharge ramp; a circuit connected to reduce the duration of said discharge ramp of said first sawtooth signal, said circuit having an input for receiving said first sawtooth signal and an output for generating a second sawtooth signal substantially synchronous with said first sawtooth signal, said second sawtooth signal having a steeper discharge ramp than said first sawtooth signal; and a comparator capable of comparing an error output signal amplified by an error amplifier with said second sawtooth signal.

According to another disclosed class of innovative embodiments, there is provided a pulse width modulator circuit, comprising: a sawtooth oscillator for generating a first sawtooth signal having a charge ramp and a discharge ramp; a circuit connected to reduce the duration of said discharge ramp of said first sawtooth signal, said circuit having an input for receiving said first sawtooth signal and an output for generating a second sawtooth signal substantially synchronous with said first sawtooth signal, said second sawtooth signal having a steeper discharge ramp than said first sawtooth signal; and a comparator capable of comparing an error output signal amplified by an error amplifier with said second sawtooth signal, said comparator having an output for generating a pulse width modulated signal; wherein said circuit reduces the duration of said discharge ramp of said first sawtooth signal by an amount substantially greater than the propagation delay of said pulse width modulated signal.

According to another disclosed class of innovative embodiments, there is provided a regulation circuit, comprising: a pulse width modulator circuit having a sawtooth oscillator for generating a first sawtooth signal having a charge ramp and a discharge ramp, a circuit connected to reduce the duration of said discharge ramp of said first sawtooth signal, said circuit having an input for receiving said first sawtooth signal and an output for generating a second sawtooth signal substantially synchronous with said first sawtooth signal, said second sawtooth signal having a steeper discharge ramp than said first sawtooth signal, and a comparator capable of comparing an error output signal amplified by an error amplifier with said second sawtooth signal; and a logic circuit being controlled by said pulse width modulator circuit, said logic circuit having an input for receiving an output signal of said comparator and an output for producing a logic drive signal.

According to another disclosed class of innovative embodiments, there is provided a method of recovering the propagation delay of a pulse width modulator signal, comprising the steps of: generating a first sawtooth signal by a sawtooth oscillator, said first sawtooth signal having a charge ramp and a discharge ramp; generating a second sawtooth signal having a steeper discharge ramp than said first sawtooth signal using a circuit connected to receive as input said first sawtooth signal and to output said second sawtooth signal, said second sawtooth signal being substantially synchronous with said first sawtooth signal; and comparing said second sawtooth signal with an error output signal amplified by an error amplifier using a comparator, said comparator having an output for generating a pulse width modulated signal.

According to another disclosed class of innovative embodiments, there is provided a method of compensating the generation and propagation delay of a control signal generated by a pulse width modulation circuit that includes an error amplifier, a sawtooth oscillator and a comparator capable of comparing an error signal amplified by said amplifier with a sawtooth signal generated by said oscillator, characterized in that comprises generating a second sawtooth signal synchronous with the sawtooth signal generated by said oscillator but having a discharge time shorter than the discharge time of the first sawtooth signal by an interval of time sufficient to compensate such delay; applying said second sawtooth signal to a respective input of said comparator.

According to another disclosed class of innovative embodiments, there is provided a pulse width modulator circuit comprising an error amplifier, a sawtooth oscillator controlled by a timing clock signal, a comparator of an amplified error signal with a sawtooth signal generated by said oscillator and at least a logic circuit capable of receiving as input an output signal of said comparator and said clock signal and capable of producing as output a logic drive signal for a controlled device, characterized in that comprises a circuit for speeding up the discharge ramp of said sawtooth signal having an input coupled to the output of said oscillator and an output coupled to the respective comparator input.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A pulse width modulator circuit, comprising:

a sawtooth oscillator for generating a first sawtooth signal having a charge ramp and a discharge ramp;

a circuit connected to reduce the duration of said discharge ramp of said first sawtooth signal, said circuit having an input for receiving said first sawtooth signal and an output for generating a second sawtooth signal substantially synchronous with said first sawtooth signal, said second sawtooth signal having a steeper discharge ramp than said first sawtooth signal, said circuit further comprising a clamp circuit that fixes the amplitude of the second sawtooth signal, and a circuit for increasing the current through the clamp circuit during the discharge ramp to prevent the amplitude of the second sawtooth signal from decreasing excessively; and a comparator capable of comparing an error output signal amplified by an error amplifier with said second sawtooth signal, wherein said comparator has an output for generating a pulse width modulated signal, and wherein said circuit reduces the duration of said discharge ramp of said first sawtooth signal by an amount substantially greater than the propagation delay of said pulse width modulated signal.

2. The pulse width modulator circuit of claim 1, wherein said second sawtooth signal has a period substantially identical to said first sawtooth signal.

3. The pulse width modulator circuit of claim 1, wherein said circuit comprises a first and second input transistors connected in parallel, a voltage follower operatively connected to said second input transistor, and an output transistor connected to anticipate said discharge ramp of said second sawtooth signal.

4. A pulse width modulator circuit, comprising:

a sawtooth oscillator for generating a first sawtooth signal having a charge ramp and a discharge ramp;

a circuit connected to reduce the duration of said discharge ramp of said first sawtooth signal, said circuit having an input for receiving said first sawtooth signal and an output for generating a second sawtooth signal substantially synchronous with said first sawtooth signal, said second sawtooth signal having a steeper discharge ramp than said first sawtooth signal; and a comparator capable of comparing an error output signal amplified by an error amplifier with said second sawtooth signal, said comparator having an output for generating a pulse width modulated signal;

wherein said circuit reduces the duration of said discharge ramp of said first sawtooth signal by an amount substantially greater than the propagation delay of said pulse width modulated signal.

5. The pulse width modulator circuit of claim 4, wherein said second sawtooth signal has a period substantially identical to said first sawtooth signal.

6. The pulse width modulator circuit of claim 4, wherein said circuit comprises first and second input transistors connected in parallel, a voltage follower operatively connected to said second input transistor, clamping circuitry connected to fix the amplitude of said second sawtooth signal, and an output transistor connected to anticipate said discharge ramp of said second sawtooth signal.

7. A regulation circuit, comprising:

a pulse width modulator circuit having:

a sawtooth oscillator for generating a first sawtooth signal having a charge ramp and a discharge ramp, a circuit connected to reduce the duration of said discharge ramp of said first sawtooth signal, said circuit having an input for receiving said first sawtooth signal and an output for generating a second sawtooth signal substantially synchronous with said first sawtooth signal, said second sawtooth signal having a steeper discharge ramp than said first sawtooth signal, and a comparator capable of comparing an error output signal amplified by an error amplifier with said second sawtooth signal; and a logic circuit being controlled by said pulse width modulator circuit, said logic circuit having an input for receiving an output signal of said comparator and an output for producing a logic drive signal, and wherein said circuit reduces the duration of said discharge ramp of said first sawtooth signal by a time interval equal to or greater than the sum of the triggering delay of said comparator and the propagation delay throughout said logic circuit.

8. The regulation circuit of claim 7, wherein said second sawtooth signal has a period substantially identical to said first sawtooth signal.

9. The regulation circuit of claim 7, wherein said circuit comprises first and second input transistors connected in parallel, a voltage follower operatively connected to said second input transistor, clamping circuitry connected to fix the amplitude of said second sawtooth signal, and an output transistor connected to anticipate said discharge ramp of said second sawtooth signal.

10. The regulation circuit of claim 7, wherein said sawtooth oscillator is controlled by a clock signal, and wherein said logic circuit comprises a bistable circuit having an input for receiving said output signal of said comparator and said clock signal.

11. The regulation circuit of claim 7, wherein said sawtooth oscillator is controlled by a clock signal, and wherein said logic circuit comprises a flip-flop circuit having an input for receiving said output signal of said comparator and said clock signal.

12. A method of recovering the propagation delay of a pulse width modulator signal, comprising the steps of:

(a) generating a firsts sawtooth signal by a sawtooth oscillator, said first sawtooth signal having a charge ramp and a discharge ramp;

(b) generating a second sawtooth signal having a steeper discharge ramp than said first sawtooth signal using a circuit connected to receive as input said first sawtooth signal and to output said second sawtooth signal, said second sawtooth signal being substantially synchronous with said first sawtooth signal;

(c) comparing said second sawtooth signal with an error output signal amplified by an error amplifier using a comparator, said comparator having an output for generating a pulse width modulated signal, and reducing the duration of the discharge ramp of the first sawtooth signal by an amount substantially greater than the propagation delay of the pulse width modulated signal.

13. The method of claim 12, wherein said first sawtooth signal has a period substantially identical to said second sawtooth signal.

14. The method of claim 12, wherein said circuit comprises first and second input transistors connected in parallel, a voltage follower operatively connected to said second input transistor, clamping circuitry connected to fix the amplitude of said second sawtooth signal, and an output transistor connected to anticipate said discharge ramp of said second sawtooth signal.

15. The method of claim 12, wherein said sawtooth oscillator is controlled by a timing clock signal, and further comprising the step of driving a device using a logic circuit, said logic circuit having an input for receiving said clock signal and said pulse width modulated signal.

16. A method of compensating the generation and propagation delay of a control signal generated by a pulse width modulation circuit that includes an error amplifier, a sawtooth oscillator and a comparator capable of comparing an error signal amplified by said amplifier with a sawtooth signal generated by said oscillator, characterized in that comprises:

generating a second sawtooth signal synchronous with the sawtooth signal generated by said oscillator but having a discharge time shorter than the discharge time of the first sawtooth signal by an interval of time sufficient to compensate such delay; and applying said second sawtooth signal to a respective input of said comparator, wherein the time interval is substantially greater than the delay.

17. A pulse width modulator circuit comprising an error amplifier, a sawtooth oscillator controlled by a timing clock signal, a comparator of an amplified error signal with a sawtooth signal generated by said oscillator and at least a logic circuit capable of receiving as input an output signal of said comparator and said clock signal and capable of producing as output a logic drive signal for a controlled device, characterized in that comprises:

a circuit for speeding up the discharge ramp of said sawtooth signal having an input coupled to the output of said oscillator and an output coupled to the respective comparator input, wherein said circuit reduces the duration of the discharge ramp of the sawtooth signal by a time interval equal or greater than the sum of the triggering delay of said comparator and of the propagation delay throughout said logic circuit.

* * * * *

UNITED STATES PATENT AND TRADEMARK OFFICE
CERTIFICATE OF CORRECTION

PATENT NO. : 5,852,632
DATED : December 22, 1998
INVENTOR(S) : Capici et al.

It is certified that error appears in the above-identified patent and that said Letters Patent is hereby corrected as shown below:

Column 4, lines 28-29

Strike:
"carry. Indeed, when the OSC discharge (CK) phase starts, the signal OSC_DISCHARGE goes high in order for M11"

Insert:
-- carry. Indeed, when the OSC discharge phase starts, the signal OSC_DISCHARGE (CK) goes high in order for M11 --

Signed and Sealed this

Thirteenth Day of April, 1999

Attest:

Q. TODD DICKINSON

*Attesting Officer*   *Acting Commissioner of Patents and Trademarks*